United States Patent
Chapman (12)

(10) Patent No.: US 6,927,377 B2
(45) Date of Patent: Aug. 9, 2005

(54) WAVELENGTH LOCKING CHANNEL MONITOR

(75) Inventor: William B. Chapman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 329 days.

(21) Appl. No.: 10/404,212

(22) Filed: Mar. 31, 2003

(65) Prior Publication Data

US 2004/0188600 A1 Sep. 30, 2004

(51) Int. Cl.[7] .................................................. G01J 1/32
(52) U.S. Cl. .................................. 250/205; 250/227.23
(58) Field of Search ........................... 250/205, 227.23, 250/227.19, 227.18, 227.11, 216; 359/260; 356/519, 506, 454, 475; 372/32, 28

(56) References Cited

U.S. PATENT DOCUMENTS 5,969,825 A    10/1999  Bomse et al.
5,973,782 A    10/1999  Bomse
6,356,350 B1    3/2002  Silver et al.
6,714,309 B2 *  3/2004  May .......................... 356/519

* cited by examiner

*Primary Examiner*—Que T. Le
(74) *Attorney, Agent, or Firm*—Blakely, Sokoloff, Taylor & Zafman LLP

(57) ABSTRACT

Prior art wavelength lockers used in tunable laser systems can provide information to ensure that the laser is locked onto a channel, but do not provide information as to which specific channel the laser is locked onto. Embodiments of the present invention include a wavelength locking channel monitor that provides a servo-locking error signal and a channel-identifying signal to allow a tunable laser to be updated to lock to the proper channel. Embodiments of the present invention include wavelength-dependent periodic and/or monotonic filters, which provide monotonically variable finesse and a monotonically variable transmission. Embodiments of the present invention also extracts amplitudes, phases, frequency, and/or modulation depths from a dither introduced in an incident light beam to determine the laser channel and the laser mode within that channel.

23 Claims, 3 Drawing Sheets

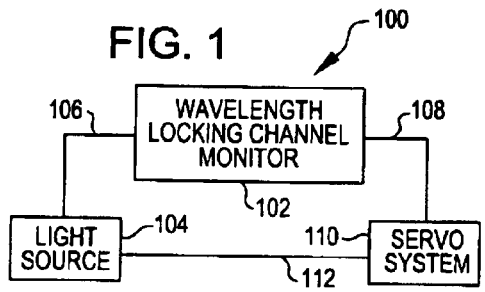
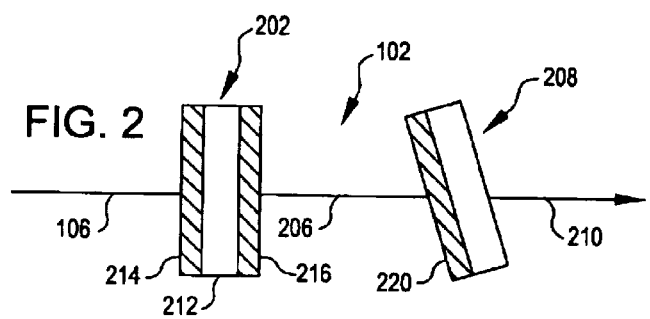
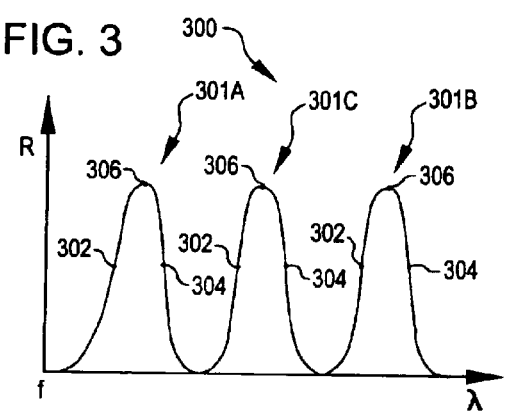
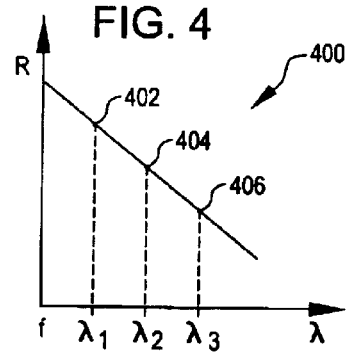
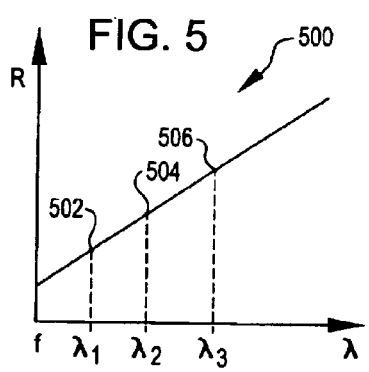
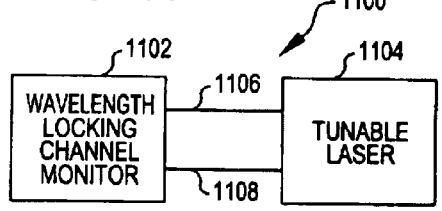

ously identified, monotonic wavelength lockers can only resolve a few channels and cannot span a full ITU band of channels.

WAVELENGTH LOCKING CHANNEL MONITOR

BACKGROUND

1. Field

Embodiments of the present invention relate to laser systems and, in particular, to tunable lasers systems.

2. Discussion of Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the unprecedented capacity (i.e., bandwidth) offered by optical fibers. Essentially, each channel has its own wavelength, and all wavelengths are separated enough to prevent overlap. The International Telecommunications Union (ITU) currently determines the channel separations.

One link of an optical telecommunication system typically has a transmitter, the optical fiber, and a receiver. The transmitter has a laser, which converts an electrical signal into the optical signal and launches it into the optical fiber. The optical fiber transports the optical signal to the receiver. The receiver converts the optical signal back into an electrical signal.

External cavity lasers (ECL) and distributed feedback (DFB) lasers are common light sources. While such lasers have typically operated at a single wavelength or channel or a small number of channels, widely tunable lasers have been recently developed that can address many channels, for example, at least all channels in one of the communication frequency bands specified by the ITU.

One difficulty in exploiting laser tunability is in guaranteeing wavelength accuracy. One aspect of wavelength accuracy is the degree to which the lasing wavelength corresponds to one of the pre-defined channels. Aging of the laser or changes in the environment can cause the laser to drift in frequency, resulting in sub-optimal performance in the fiber optic network.

Components known as wavelength lockers have been employed to combat wavelength drift. Known wavelength lockers fall into two categories: periodic and monotonic.

Known periodic wavelength lockers provide error signals to correct laser output frequency to one of the evenly spaced ITU optical frequency channels. Periodic wavelength lockers do not distinguish between the channels, however. This means that known periodic wavelength lockers provide signals to lock onto a channel but the channel may be an incorrect channel.

Known monotonic wavelength lockers also provide error signals to correct laser output frequency to one of the evenly spaced ITU optical frequency channels. The response of monotonic wavelength lockers varies so strongly with wavelength that ITU channels can be uniquely identified. To be able to uniquely identify a channel, monotonic wavelength lockers can only resolve a few channels and cannot span a full ITU band of channels.

Thus, a servo system based on known wavelength lockers will typically cause the laser wavelength to be updated to lock to the nearest pre-defined channel, which may be the wrong channel. This error will not be detected and will result incorrect routing of any data on the light beam.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 1 is a high-level block diagram of laser system according to an embodiment of the present invention;

FIG. 2 is a high-level block diagram showing an example wavelength locking channel monitor according to an embodiment of the present invention;

FIG. 3 is a graphical representation of a periodic response of a periodic filter to a light beam according to an embodiment of the present invention;

FIG. 4 is a graphical representation of a monotonic response of a periodic filter to a light beam according to an embodiment of the present invention;

FIG. 5 is a graphical representation of a monotonic response of a monotonic filter according to an alternative embodiment of the present invention;

FIG. 11 is a schematic diagram of a communication system according to an embodiment of the present invention.

DETAILED DESCRIPTION OF THE ILLUSTRATED EMBODIMENTS

Figure 6A:
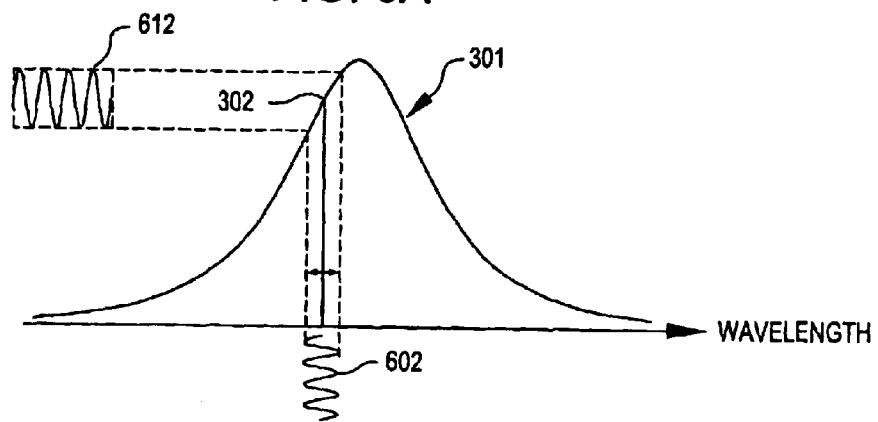
FIGS. 6A, 6B, and 6C are graphical representations of the relationship between the wavelength dither on a light beam and resulting amplitude modulation of the light beam according to an embodiment of the present invention wavelength dither.

FIG. 1 is a high-level block diagram of laser system 100 according to an embodiment of the present invention. The system 100 includes a wavelength locking channel monitor (WLCM) 102 coupled to a light source 104, which provides a light beam 106 to the WLCM 102. The WLCM 102 receives the light beam 106 and generates a signal 108 having a periodic optical response and a monotonic optical response to the light beam 106. The signal 108 is coupled to the servo system 110. The servo system 110 may provide signals 112 to the light source 104.

FIG. 2 is a schematic diagram of the example WLCM 102 according to an embodiment of the present invention. The example WLCM 102 includes a filter 202 optically coupled to receive the light beam 106 having a wavelength dither introduced thereon and to produce an amplitude modulated (AM) signal by means of a wavelength to amplitude transfer function of the filter 202. The example WLCM 102 includes a photodetector 208 optically coupled to detect an amplitude, a phase, a frequency, and a modulation depth of the AM signal in the light beam 206. The photodetector 208 may provide a signal 210 based on the amplitude, phase, frequency, and/or modulation depth of the AM signal to servo-lock the light source 104 to a point on a transmission peak and to identify the wavelength of the transmission peak. In one embodiment, the signal 210 is coupled to the servo system 110.

In one embodiment, the filter 202 includes an optical element 212 having a periodic filter 214 (e.g., coating; wavelength locker) and a monotonic filter 216 (e.g., coating; channel identifier). The coating 214 may provide a periodic response to light beams for the servo system 110 servo-lock error signals. The periodic filter 214 may be used to reduce the resolution required for the monotonic filter 216 that the range of the monotonic filter 216 may span a broad range of frequencies.

In embodiments of the present invention, the example WLCM 102 provides several transmission (reflection, absorption) peaks that are evenly spaced and that vary monotonically in finesse in response to the light beam 106. Finesse is defined as the separation (in optical frequency) between adjacent peaks of the periodic transmission function divided by the transmission bandwidth of a single peak taken at the half-maximum points. The distance or separation between peaks is defined as the "free spectral range (FSR)." The finesse is defined as "full width half maximum" divided by FSR, or FWHM/FSR, where FWHM is the bandpass of the transmission peak. In embodiments of the present invention, finesse is wavelength-dependent, i.e., variable.

FIG. 3 is a graphical representation of a periodic response 300 of the WLCM 102 to the light beam 106 according to an embodiment of the present invention, in which response R is plotted as a function of wavelength λ (or optical frequency). The periodic response 300 may be a transmission function (as illustrated), a reflection function, an absorption function, or other suitable periodic function (e.g., polarization, dual beam interference, etc.).

The periodic response 300 includes several transmission (reflection, absorption) peaks 301 (A, B, and C) that are evenly spaced in optical frequency. Each transmission peak 301 includes a point of maximum positive slope 302, a point of maximum negative slope 304, and an transmission apex 306. Each transmission peak 301 may correspond to an ITU grid passband (or channel). In one embodiment, there is a one-to-one correspondence between the periodic response 300 and ITU grid optical frequencies (or other similar grid of optical frequencies). This can be accomplished by aligning the apexes 306 to the grid. Alternatively, this may be accomplished by aligning the point of maximum positive slope 302 or the point of maximum negative slope 304 to the grid. Alternatively still, one-to-one correspondence between the periodic response 300 and ITU grid optical frequencies may be accomplished by biasing the servo system 110 to lock to a fixed offset from the point of maximum positive slope 302, the point of maximum negative slope 304, or the transmission apex 306.

In one embodiment, each point of maximum positive slope 302 may be detected from the periodic filter 214 and used to lock the light source 104 onto the wavelength λ associated with the particular point of maximum positive slope 302. In an alternative embodiment, each point of maximum negative slope 304 may be detected and used to lock the light source 104 onto the wavelength λ associated with the particular point of maximum positive slope 302. Alternatively still, each transmission apex 306 may be detected and used to lock the light source 104 onto the wavelength λ associated with the particular transmission apex 306. Of course, embodiments of the present invention may be directed to locking on other points on the transmission peaks 301.

The WLCM 102 provides a monotonic response to the light beam 106 according to embodiments of the present invention. FIG. 4 is a graphical representation of a monotonic response 400 of the WLCM 102 according to an embodiment of the present invention in which response R is plotted as a function of wavelength λ. The monotonic response 400 may be linear or nonlinear and has the shape $dR/d\lambda<0$ and thus has a negative slope. The example monotonic response 400 has a point 402 at a wavelength $\lambda_1$, a point 404 wavelength $\lambda_2$, and point 406 wavelength $\lambda_3$.

FIG. 5 is a graphical representation of a monotonic response 500 of the monotonic filter 216 according to an embodiment of the present invention in which response R is plotted as a function of wavelength λ. The example monotonic response 500 is similar to the monotonic response 400 except that the monotonic response 500 has the shape $dR/d\lambda>0$, which makes its slope positive. The example monotonic response 500 has a point 502 at a wavelength $\lambda_1$, a point 504 wavelength $\lambda_2$, and point 506 wavelength $\lambda_3$.

The example WLCM 102 provides several transmission (reflection, absorption) peaks 301 (A, B, and C) that are evenly spaced and that vary in bandwidth (i.e., bandpass (full-width-half-maximum (FWHM)) and curvature) in response to the light beam 106

Figure 6B:
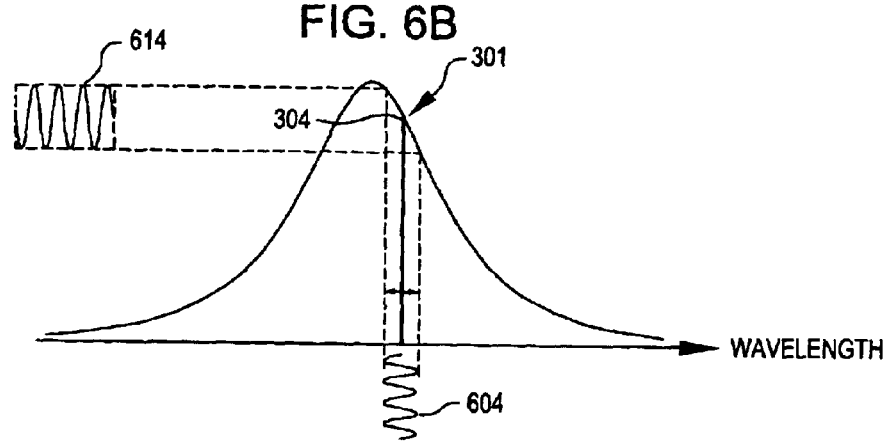
Figure 6C:
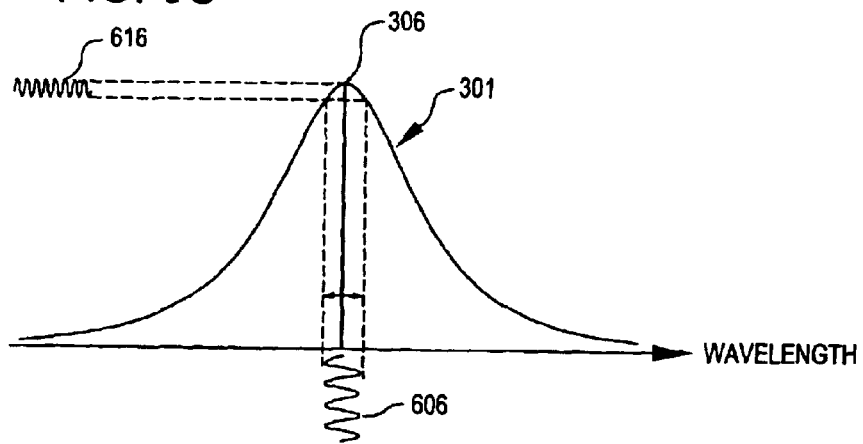

In one embodiment of the present invention, the light source 104 introduces a wavelength dither (i.e., modulation to the optical frequency)into the light beam 106 using any well-known or proprietary technique (e.g., lithium niobate electro-optic, acousto-optic device, mechanical device). The wavelength dither is applied with a suitable modulation frequency f. FIGS. 6A, 6B, and 6C are graphical representations of the relationship between the wavelength dither on the light beam 106 and resulting amplitude modulation of the light beam 106 according to an embodiment of the present invention. FIG. 6A includes a wavelength dither signal 602, FIG. 6B includes a wavelength dither signal 604, and FIG. 6C includes a wavelength dither signal 606. Each of the wavelength dither signals has a wavelength dither at a particular frequency.

Any one of the wavelength dither signals 602, 604, and 606 may be introduced at any one of the points 302, 304, and 306, respectively on one of the transmission peaks 301. The transmission profile of any one of the transmission peaks 301 acts as a transfer function transforming wavelength dither to intensity (or amplitude) modulation.

FIG. 6A illustrates that the wavelength dither signal 602 introduced at the point of maximum positive slope 302 produces an amplitude modulated (AM) signal 612 resulting from wavelength dither of a laser mode that is offset from the center of the transmission peak 301. The location of the point of maximum positive slope 302 at a wavelength shorter than that of the center wavelength at the transmission apex 306 results in the AM signal 612 having a frequency f and appearing substantially in phase with the wavelength of the wavelength dither signal 602. Note that during the wavelength dither cycle as the modulation wavelength increases the amplitude of the AM signal 612 increases.

FIG. 6B illustrates that the wavelength dither signal 604 introduced at the point of maximum negative slope 304 produces an associated AM signal 614 resulting from wavelength dither of a laser mode that also is offset from the center of the transmission peak 301. The location of the point of maximum negative slope 304 at a wavelength greater than that of the center wavelength at the transmission.apex 306 results in the AM signal 614 having frequency f and appearing substantially 180 degrees out of phase with the modulation wavelength of the wavelength dither signal 604. Note that during the wavelength dither cycle a shift to lesser wavelengths results in an increase in amplitude for the AM signal 614 and a shift to greater modulation wavelengths results in a decrease in amplitude for the AM signal 614.

FIG. 6C illustrates that the wavelength dither signal 606 introduced at the transmission apex 306 produces an associated amplitude modulated (AM) signal 616 resulting from wavelength dither of the laser mode that is centered under the transmission peak 301. The location of the transmission apex 306 at this point results in the AM signal 616 having a frequency that is twice the frequency of the wavelength dither signal 606. Importantly, the amplitude modulation at the dither frequency f is minimized when the center wavelength of the optical beam 106 is aligned with a transmission peak of the WLCM 102.

A detector may detect any one of the AM signals 612, 614, and 616 and determine from its amplitude at which point 302 or 304 on the transmission peak 301 the wavelength dither is being introduced. For example, the AM signals 612 and 614 are proportional to $dR/d\lambda$, which is the local slope of the AM signals 612 and 614, and the AM signal 616 is proportional to $d^2R/d\lambda^2$, which is the local curvature of the AM signal 616.

The transmission peak 301A has a curvature that is different from the transmission peak 301B, which is different from the curvature of the transmission peak 301C, i.e., each varies in bandpass and curvature in response to the light beam 106). Different curvatures for the different transmission peaks 301 provide different modulation depths for the AM signals 616.

Figure 7:
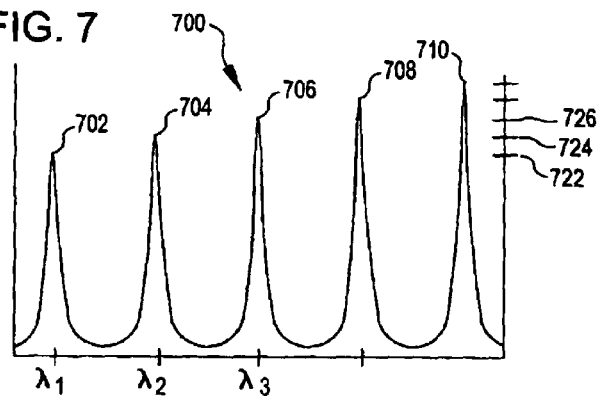
FIG. 7 is a graphical representation of a response of a wavelength locking channel monitor according to an embodiment of the present invention.

FIG. 7 is a graphical representation of a response 700 provided by the WLCM 102 to a light beam having an introduced dither according to an embodiment of the present invention in which response R is plotted as a function of wavelength $\lambda$. The response 700 is a transmission function with evenly spaced transmission peaks 702, 704, 706, 708, and 710. Each transmission peak 702, 704, 706, 708, and 710 has a different amplitude and a different wavelength. For example, the transmission peak 702 is at a wavelength $\lambda_1$ and an amplitude 722, the transmission peak 704 is at a wavelength $\lambda_2$ and an amplitude of 724, and the transmission peak 706 is at a wavelength $\lambda_3$ and an amplitude of 726. In one embodiment, the response 700 is the combination of the response 300 and the response 500.

Referring back to FIG. 2, recall that the filter 202 is optically coupled to receive the light beam 106 and the light beam 106 may have a wavelength dither introduced thereon to produce an amplitude modulated (AM) signal by means of a wavelength to amplitude transfer function of the filter 202. In one embodiment, the photodetector 208 may detect any one of the AM signals 612, 614, and 616 and determine from its amplitude, phase, wavelength dither, and/or modulation depth the light source 104 channel (i.e., which transmission peak 702, 704, 706, 708, or 710) and the light source 104 mode (i.e., which point 302, 304, or 306 within the transmission peak 702, 704, 706, 708, or 710). In an embodiment of the present invention, the photodetector 208 may be tilted with respect to the light beam 206 to reduce unwanted optical feedback.

In another embodiment, the detected points 302, 304, or 304 may be used to lock the light source 104 onto the wavelength associated with the particular detected point 302, 304, or 306. For example, a wavelength may be servo-locked to a point 302, 304, or 306 by averaging the power of the transmission peak 206, comparing the averaged power to an expected power level based on wavelength and light source 104 current, and identifying the channel of the light source 104 using the comparison. Of course, embodiments of the present invention may be directed to locking on other points on the transmission peaks 301.

In one embodiment, the optical element 212 is a Fabry-Perot etalon, the periodic filter 214 (wavelength locker 214) is a reflective coating whose response is fairly constant with wavelength over a useful range, and the monotonic filter 216 (channel identifier 216) is a reflective coating whose response varies with wavelength over the same useful range.

In an alternative embodiment, the optical element 212 is a Fabry-Perot etalon, the periodic filter 214 (wavelength locker 214) is a reflective coating whose response is fairly constant with wavelength over a useful range, and the monotonic filter 216 (channel identifier 216) is an absorptive coating whose response varies with wavelength over the same useful range.

In still another embodiment, the optical element 212 is a Fabry-Perot etalon, the periodic filter 214 (wavelength locker 214) and the monotonic filter 216 (channel identifier 216) are reflective coatings whose responses are fairly constant with wavelength over a useful range, and the photodetector 208 has a coating 220 (e.g., reflective, absorptive) whose response varies with wavelength over the same useful range.

In an alternative embodiment, the optical element 212 is a wavelength-dependent absorptive substrate, the periodic filter 214 (wavelength locker 214) is a reflective coating whose response is fairly constant with wavelength over a useful range, and the monotonic filter 216 (channel identifier 216) is a reflective coating whose response varies with wavelength over the same useful range.

While embodiments of the present invention will be described with respect to a wavelength locking channel monitor providing servo-locking and channel identification for a tunable external cavity laser, wavelength locking channel monitors implemented according to embodiments of the present invention may provide servo-locking and channel identification for addressable distributed feedback (DFB) laser arrays, tunable semiconductor lasers, tunable optically pumped lasers, and the like. For example, the After reading the description herein, persons of ordinary skill in the relevant art will readily recognize how to implement embodiments of the present invention for other photonic devices.

Servo systems suitable for implementing the servo system 110 are well known. Photodetectors suitable for implementing the photodetector 208 are well known.

Figure 8:
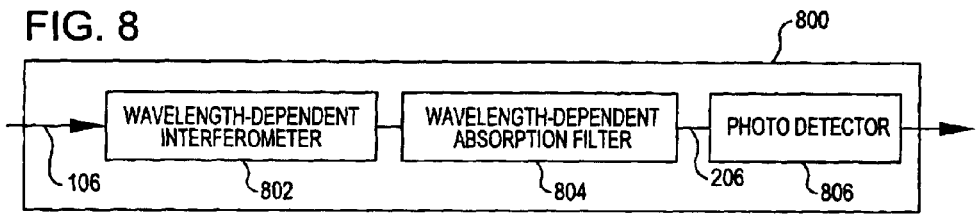
FIG. 8 is a schematic diagram of a wavelength locking channel monitor according to an alternative embodiment of the present invention.

FIG. 8 is a schematic diagram of a wavelength locking channel monitor (WLCM) 800 according to an embodiment of the present invention. The WLCM 800 includes a wavelength-dependent interferometer 802, such as a Mach-Zender interferometer, coupled to a wavelength-dependent absorption filter 804, such as a thin film dielectric coating on a glass substrate, and a photodetector 806.

In operation, the light beam 106 with an AM signal 612, 614, or 616 and passes through the WLCM 800, which provides the transmission peak 206 in response to the light beam 106. In one embodiment, the photodetector 806 may detect any one of the AM signals 612, 614, and 616 within the transmission peak 206 and determine from its amplitude, phase, wavelength dither, and/or modulation depth the light source 104 channel (i.e., which transmission peak 702, 704, 706, 708, or 710) and the light source 104 mode (i.e., which point 302, 304, or 306 within the transmission peak 702, 704, 706, 708, or 710).

Figure 9:
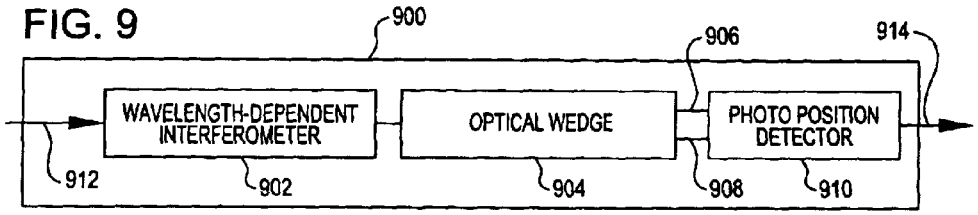
FIG. 9 is a schematic diagram of a wavelength locking channel monitor according to an alternative embodiment of the present invention.

FIG. 9 is a schematic diagram of a wavelength locking channel monitor (WLCM) 900 according to an embodiment of the present invention. The WLCM 900 includes a wavelength-dependent interferometer 902, such as a planar waveguide Mach-Zender interferometer, coupled to an optical wedge 904, such as a prism. The optical wedge 904 is coupled to two or more waveguides 906 and 908, which are coupled to a position-sensitive photodetector 910, such as a linear position detector, a split photodiode, a split detector, or a bi-cell, or suitable equivalent a photodetector.

In operation, a light beam 912, which may or may not have an AM signal 616, passes through the wavelength-dependent interferometer 902 and the optical wedge 904. The monotonic response in this embodiment is monotonic wavelength-dependent angular displacement. The position-sensitive photodetector 910 senses the angular displacement. A wavelength may be servo-locked to a point (302, 304, or 306) by considering the sum of the position-sensitive photodetector 910 outputs 914 using a well-known or proprietary summing technique. The outputs 914 of the photo position-sensitive detector 910 may be differenced to identify the specific channel using a well-known or proprietary differencing technique.

Figure 10:
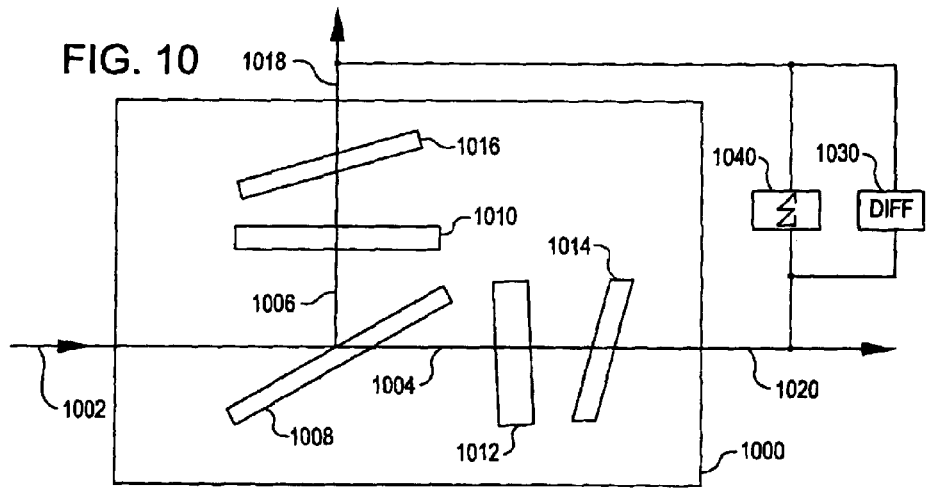
FIG. 10 is a schematic diagram of a wavelength locking channel monitor according to an alternative embodiment of the present invention.

FIG. 10 is a schematic diagram of a wavelength locking channel monitor (WLCM) 1000 according to an embodiment of the present invention, in which a light beam 1002 is split into two beam portions 1004 and 1006 by a beam splitter 1008. The beam portion 1004 passes through a filter 1010, such as an etalon, while beam portion 1006 passes through a filter 1012, such as a fractional wave plate and polarizer. The beam portion 1004 is detected by a photodetector 1014. The beam portion 1006 is detected by a photodetector 1016.

In operation, a wavelength may be servo-locked to a slope point (302 or 304) or a peak point (306) by considering the sum of the outputs 1020 and 1018 of the photodetectors 1014 and 1016, respectively. The differencing circuitry 1030 may difference the outputs 1020 and 1018 to identify the specific channel. Summing circuitry 1040 may sum the outputs 1020 and 1018 to servo-lock a wavelength to a point 302, 304, or 306. In one embodiment, the photodetectors 1014 and 1016 may be tilted with respect to the normal of the beam portions 1004 and 1006 to avoid unwanted optical feedback.

FIG. 11 is a high-level block diagram of a communication system 1100 according to embodiments of the present invention. The example communication system 1100 includes wavelength locking channel monitor 1102 and a tunable laser 1104. The example tunable laser may provide a light beam 1106, which may have a wavelength dither introduced thereon. The wavelength locking channel monitor 1102 may be implemented according to embodiments of the present invention.

For example, the wavelength locking channel monitor 1102 may include a filter optically coupled to receive the light beam 1106 from the tunable laser 1104 and to produce a transmission peak. The transmission peak may include any one of the AM signals 612, 614, or 616. The wavelength locking channel monitor 1102 also may include a photodetector (such as the photodetector 208) optically coupled to detect the AM signal 612, 614, or 616 and to provide a signal 1108 to identify the wavelength of the transmission peak and to enable the tunable laser 1104 to servo-lock to the positive slope 302, the negative slope 304, or the transmission apex 306 of the transmission peak, respectively.

Embodiments of the invention can be implemented using hardware, software, firmware, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a filter optically coupled to receive a light beam having a wavelength dither introduced thereon and to produce an amplitude modulated (AM) signal, the AM signal having an amplitude, a phase, a frequency, and a modulation depth corresponding to a wavelength of the optical beam and at least one of a positive slope, a negative slope, or an apex of the optical beam;

a photodetector optically coupled to detect the AM signal and to provide a signal to identify the wavelength of the optical beam and to enable servo-lock of the emitted wavelength of a light source to the positive slope, the negative slope, or the apex of the transmission peak, respectively.

2. The apparatus of claim 1, wherein the filter includes a Fabry-Perot etalon having a first reflective coating, and a second reflective coating and at least one of the reflective coatings having a response that varies with wavelength.

3. The apparatus of claim 1, wherein the filter includes a Fabry-Perot etalon having a reflective coating, the reflective coating having a response that is substantially constant with wavelength, and an absorptive coating, the absorptive coating having a response that varies with wavelength.

4. The apparatus of claim 3, wherein the photodetector includes a reflective coating, the reflective coating having a response that varies with wavelength.

5. The apparatus of claim 1, wherein the filter includes an absorptive substrate having a first reflective coating, the first reflective coating having a response that is substantially constant with wavelength, and a second reflective coating, the second reflective coating having a response that is substantially constant with wavelength, the absorptive substrate having a response that varies with wavelength.

6. The apparatus of claim 1, wherein the filter includes a wavelength-dependent interferometer.

7. The apparatus of claim 6, wherein the wavelength-dependent interferometer includes a Mach-Zender interferometer.

8. The apparatus of claim 7, wherein the wavelength-dependent interferometer includes a planar waveguide interferometer.

9. The apparatus of claim 1, wherein the filter includes a wavelength-dependent absorption filter.

10. The apparatus of claim 9, wherein the wavelength-dependent absorption filter includes a thin-film dielectric coating on a glass substrate.

11. The apparatus of claim 6, wherein the filter includes an optical wedge to refract the optical beam to an extent depending on wavelength.

12. The apparatus of claim 11, wherein the photodetector includes a position-sensitive detector.

13. The apparatus of claim 9, wherein the wavelength-dependent filter comprises a fractional wave plate and polarizer.

14. A method, comprising:

passing a light beam having a dither introduced thereon through a filter to produce a light beam having an amplitude modulated (AM) signal;

detecting an amplitude, a phase, a frequency, and a modulation depth of the AM signal;

servo-locking a laser to a point on a transmission peak associated with the AM signal amplitude, phase, and frequency; and identifying wavelength of the transmission peak associated with the AM signal modulation depth.

15. The method of claim 14, wherein passing a light beam having a dither introduced thereon through a filter comprises passing a light beam having a dither introduced thereon through a Fabry-Perot etalon having a first reflective coating, the first reflective coating having a response that is substantially constant with wavelength, and a second reflective coating, the second reflective coating having a response that varies with wavelength.

16. The method of claim 14, wherein passing a light beam having a dither introduced thereon through a filter comprises passing a light beam having a dither introduced thereon through a wavelength-dependent absorption filter.

17. The method of claim 16, passing a light beam having a dither introduced thereon through a filter comprises passing a light beam having a dither introduced thereon through a wavelength-dependent interferometer.

18. A system, comprising:

an external cavity laser to provide a light beam having a dither introduced thereon; and a filter optically coupled to receive the light beam and to produce an amplitude modulated (AM) signal, the AM signal having an amplitude, a phase, a frequency, and a modulation depth corresponding to a wavelength of a transmission peak and at least one of a positive slope, a negative slope, or an apex of the transmission peak a photodetector optically coupled to detect the AM signal and to provide a signal to identify the wavelength of the transmission peak and to enable servo-lock of a light source to the positive slope, the negative slope, or the apex of the transmission peak, respectively.

19. The system of claim 18, wherein the filter includes a Fabry-Perot etalon having a first reflective coating, the first reflective coating having a response that is substantially constant with wavelength, and a second reflective coating, the second reflective coating having a response that varies with wavelength.

20. The system of claim 18, wherein the filter includes Fabry-Perot etalon having a reflective coating, the reflective coating having a response that is substantially constant with wavelength, and an absorptive coating, the absorptive coating having a response that varies with wavelength.

21. An apparatus, comprising:

a beam splitter optically coupled to direct a first portion of a light beam to a first filter having a periodic response to the light beam and a second portion of the light beam to a second filter having a monotonic response to the light beam, the light beam emitted from a light source;

a first photodetector optically coupled to detect the first portion of the light beam;

a second photodetector optically coupled to detect the second portion of the light beam;

differencing circuitry coupled to the first and second photodetectors to identify a transmission peak wavelength of the light beam; and summing circuitry coupled to the first and second photodetectors to servo-lock the light source to a point on the transmission peak.

22. The apparatus of claim 21, wherein the first filter includes a wavelength-dependent interferometer.

23. The apparatus of claim 21, wherein the second filter includes a wavelength-dependent absorber.

* * * * *